United States Patent
Chang et al.

(10) Patent No.: US 7,489,200 B2
(45) Date of Patent: Feb. 10, 2009

(54) GAIN CONTROLLABLE LOW NOISE AMPLIFIER AND WIRELESS COMMUNICATION RECEIVER HAVING THE SAME

(75) Inventors: Jae-Hong Chang, Seongnam-si (KR); Byeong-Ha Park, Seongnam-si (KR); Sang-Yeob Lee, Suwon-si (KR); Seung-Chan Heo, Yongin-si (KR); Han-Gun Chung, Seongnam-si (KR); Hyun-Won Mun, Yongin-si (KR); Min-Kyu Je, Anyang-si (KR); Seong-Han Ryu, Yongin-si (KR); Kwang-Seok Han, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 103 days.

(21) Appl. No.: 11/588,651

(22) Filed: Oct. 27, 2006

(65) Prior Publication Data

US 2007/0164826 A1 Jul. 19, 2007

(30) Foreign Application Priority Data

Jan. 18, 2006 (KR) .................. 10-2006-0005444

(51) Int. Cl.
*H03F 3/04* (2006.01)

(52) U.S. Cl. ............... 330/311; 330/278; 330/291
(58) Field of Classification Search ............... 330/311, 330/278, 291; 455/234.1
See application file for complete search history.

(56) References Cited

U.S. PATENT DOCUMENTS

| | | | | |
|---|---|---|---|---|
| 4,174,503 A | * | 11/1979 | Merklinger et al. | 330/300 |
| 5,945,880 A | | 8/1999 | Souetinov | 330/311 |
| 6,483,383 B2 | * | 11/2002 | Wu | 330/253 |
| 6,864,751 B1 | * | 3/2005 | Schmidt et al. | 330/311 |
| 6,894,564 B1 | * | 5/2005 | Gilbert | 330/254 |
| 6,930,554 B2 | * | 8/2005 | Mondal et al. | 330/282 |
| 7,292,102 B2 | * | 11/2007 | Lee et al. | 330/254 |

FOREIGN PATENT DOCUMENTS

| | | |
|---|---|---|
| JP | 10-075127 | 3/1998 |
| KR | 100249497 | 12/1999 |
| KR | 1020000041721 | 7/2000 |

* cited by examiner

*Primary Examiner*—Patricia Nguyen
(74) *Attorney, Agent, or Firm*—F. Chau & Assoc., LLC

(57) ABSTRACT

A gain controllable wide-band low noise amplifier includes a first transistor coupled to an input node and an output node and amplifying an input signal to generate an output signal, a second transistor allowing the output signal to feedback to the input node, and a control circuit complementarily controlling transconductance of the first and second transistors.

14 Claims, 9 Drawing Sheets

(a)  (b)

FIG. 4
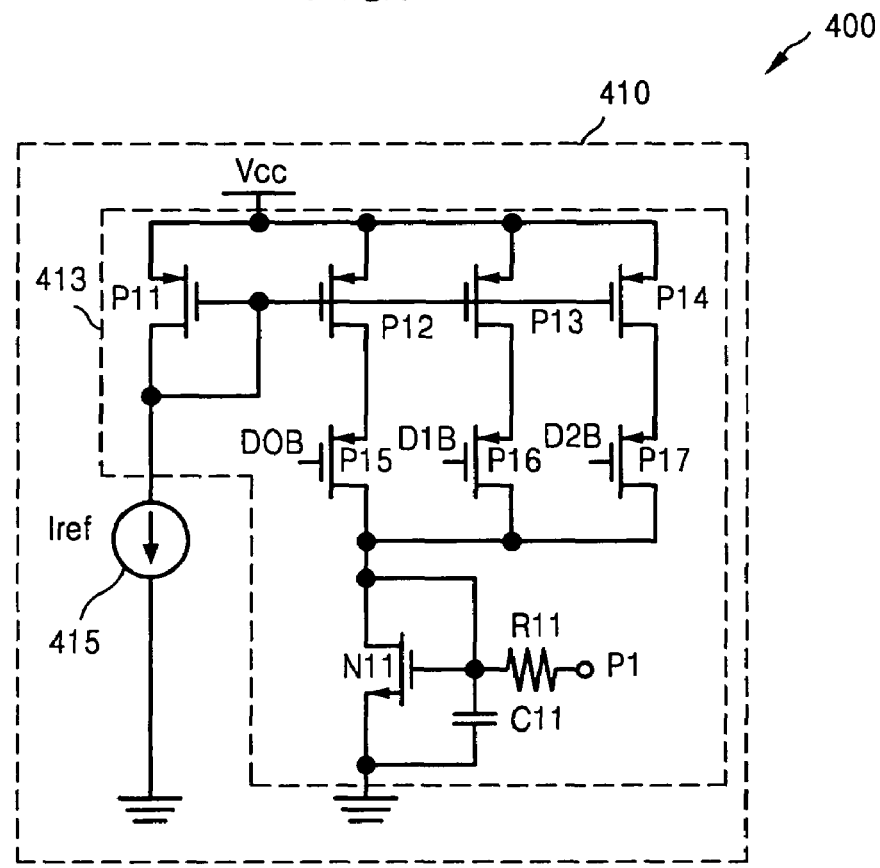
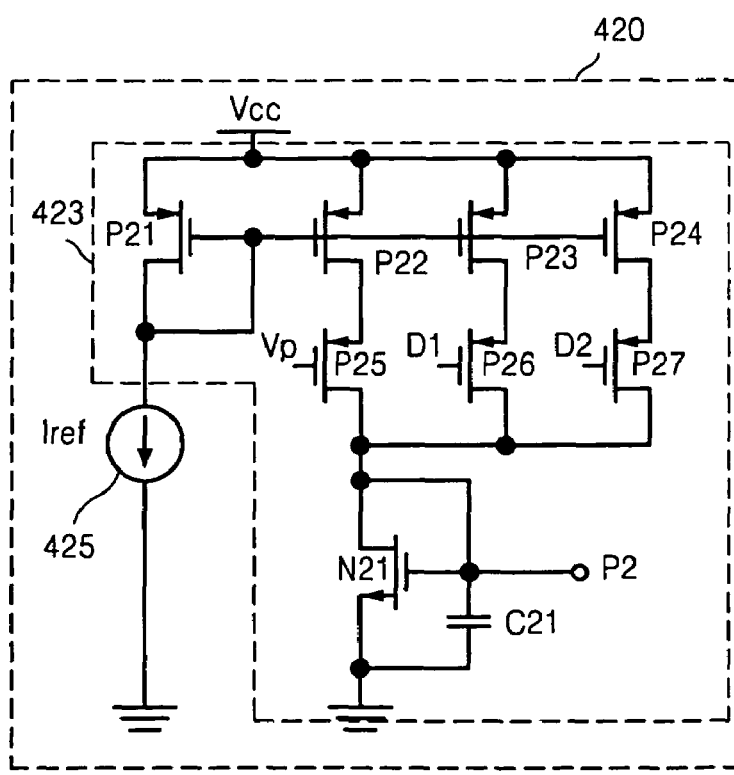

GAIN CONTROLLABLE LOW NOISE AMPLIFIER AND WIRELESS COMMUNICATION RECEIVER HAVING THE SAME

CROSS-REFERENCE TO RELATED PATENT APPLICATIONS

This application claims priority to Korean Patent Application No. 10-2006-0005444, filed on Jan. 18, 2006, the disclosure of which is herein incorporated by reference in its entirety.

BACKGROUND OF THE INVENTION

1. Technical Field

The present disclosure relates to a wide-band low-noise amplifier (LNA) and, more particularly, to a wide-band radio frequency (RF) LNA with a controllable gain.

2. Discussion of the Related Art

Typically, wide-band wireless communication receivers use a high performance front-end amplifier, which is referred to as a low-noise amplifier. The low-noise amplifier should have excellent noise and linearity characteristics in a wide frequency range and for a wide range of input signal power.

It is very difficult to implement a front-end gain controllable amplifier that combines low noise and high linearity over a wide frequency range. In a front-end amplifier, the trade off between noise and linearity can be managed by controlling the gain according to the magnitude of the input signal. When the input signal is weak, the low-noise amplifier (LNA) requires a high gain and low noise performance. In contrast, when the input signal is strong, the LNA requires a relatively lower gain and high linearity performance.

FIGS. 1A and 1B are circuit diagrams of conventional amplifiers. In FIG. 1A, an amplifier includes an amplifying transistor T1 and a load $R_D$. The gain Av, input impedance Rin, and noise factor F of the amplifier of FIG. 1A can be expressed by Equation 1.

$$Av = g_m R_D \quad \text{[Equation 1]}$$
$$Rin = \frac{1}{g_m}$$
$$F = 1 + \frac{\gamma}{g_m R_S},$$

where "$g_m$" is the transconductance of the amplifying transistor T1, "$R_S$" is the source resistance of an input power, and "$\gamma$" is a parameter of the amplifying transistor T1.

In FIG. 1B, an amplifier includes the amplifying transistor T1, the first load $R_D$ and a second load $R_F$. The gain Av, input impedance Rin, and noise factor F of the amplifier of FIG. 1B can be expressed by Equation 2.

$$Av = -\frac{g_m R_D}{1 + R_D/R_F} \quad \text{[Equation 2]}$$
$$Rin = \frac{1}{g_m}\left(1 + \frac{R_F}{R_D}\right)$$
$$F = 1 + \frac{3.6}{g_m R_S},$$

where "$g_m$" is the transconductance of the amplifying transistor T1 and "$R_S$" is the source resistance of an input power.

As can be seen from Equations 1 and 2, in a conventional amplifier, a trade-off relationship exists between the gain Av and the input impedance Rin. That is, to control the gain Av, when the transconductance of the amplifying transistor T1 is adjusted, the input impedance Rin is also adjusted.

For a conventional LNA used in a communication receiver, the input impedance needs to match a predetermined value, for example, 75 Ω or 50 Ω. However, as described above, for a conventional amplifier, when the gain is adjusted, the input impedance is also adjusted and the correct impedance matching is not maintained.

SUMMARY OF THE INVENTION

According to an exemplary embodiment of the present invention, a gain controllable wide-band low noise amplifier comprises a first transistor coupled to an input node and an output node and amplifying an input signal to generate an output signal, a second transistor allowing the output signal to feedback to the input node, and a control circuit complementarily controlling transconductance of the first and second transistors.

According to an exemplary embodiment of the present invention, a gain controllable wide-band low noise amplifier comprises an amplification portion amplifying an input signal to generate an output signal, a feedback portion allowing the output signal to feedback to an input node, and a control circuit complementarily controlling the amount of current flowing through the amplification portion and the amount of current flowing through the feedback portion.

According to an exemplary embodiment of the present invention, a wide-band wireless communication receiver comprises a low noise amplifier amplifying an input signal, a mixer down-converting a frequency of an output signal of the low noise amplifier, an A/D converter converting an output signal of the mixer to a digital signal, and a digital signal processor restoring data from the digital signal, wherein the low noise amplifier comprises an amplification portion amplifying an input signal to generate an output signal, a feedback portion allowing the output signal to feedback to an input node, and a control circuit complementarily controlling the amount of current flowing through the amplification portion and the amount of current flowing through the feedback portion.

BRIEF DESCRIPTION OF THE DRAWINGS

The present invention will become readily apparent to those of ordinary skill in the art when descriptions of exemplary embodiments thereof are read with reference to the accompanying drawings.

FIG. 4 is a circuit diagram of the control circuit of FIG. 3, according to an exemplary embodiment of the present invention.

DESCRIPTION OF EXEMPLARY EMBODIMENTS

Figure 1:
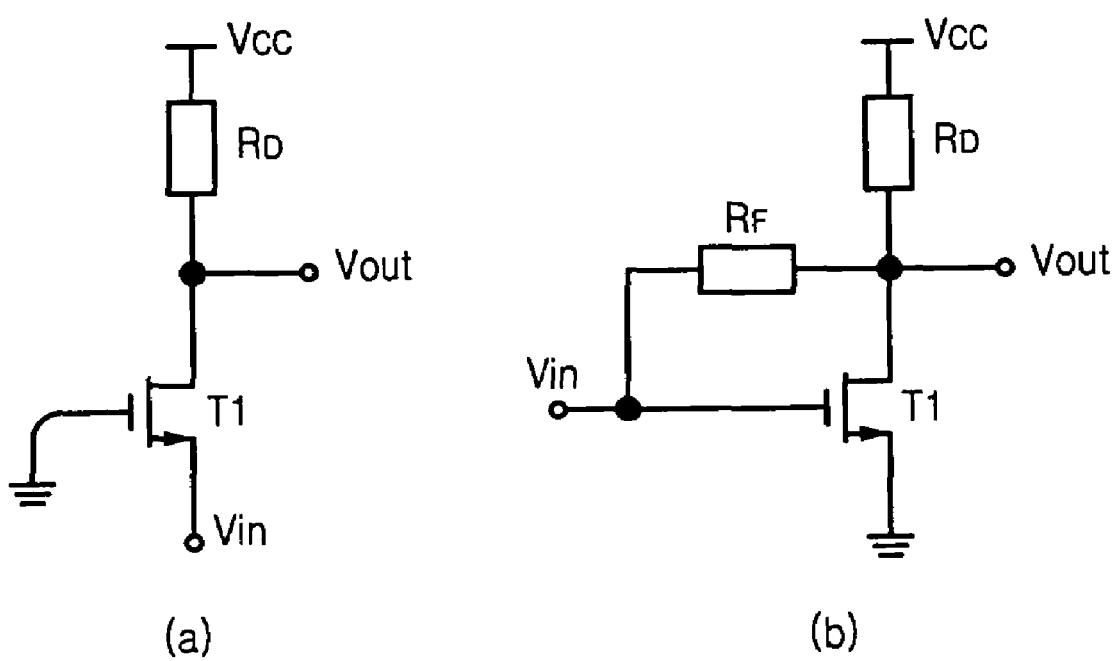
FIG. 1 is a circuit diagram of a conventional amplifier.

Hereinafter, exemplary embodiments of the present invention will be described in detail with reference to the accompanying drawings. Like reference numerals refer to similar or identical elements throughout the description of the figures.

Figure 2:
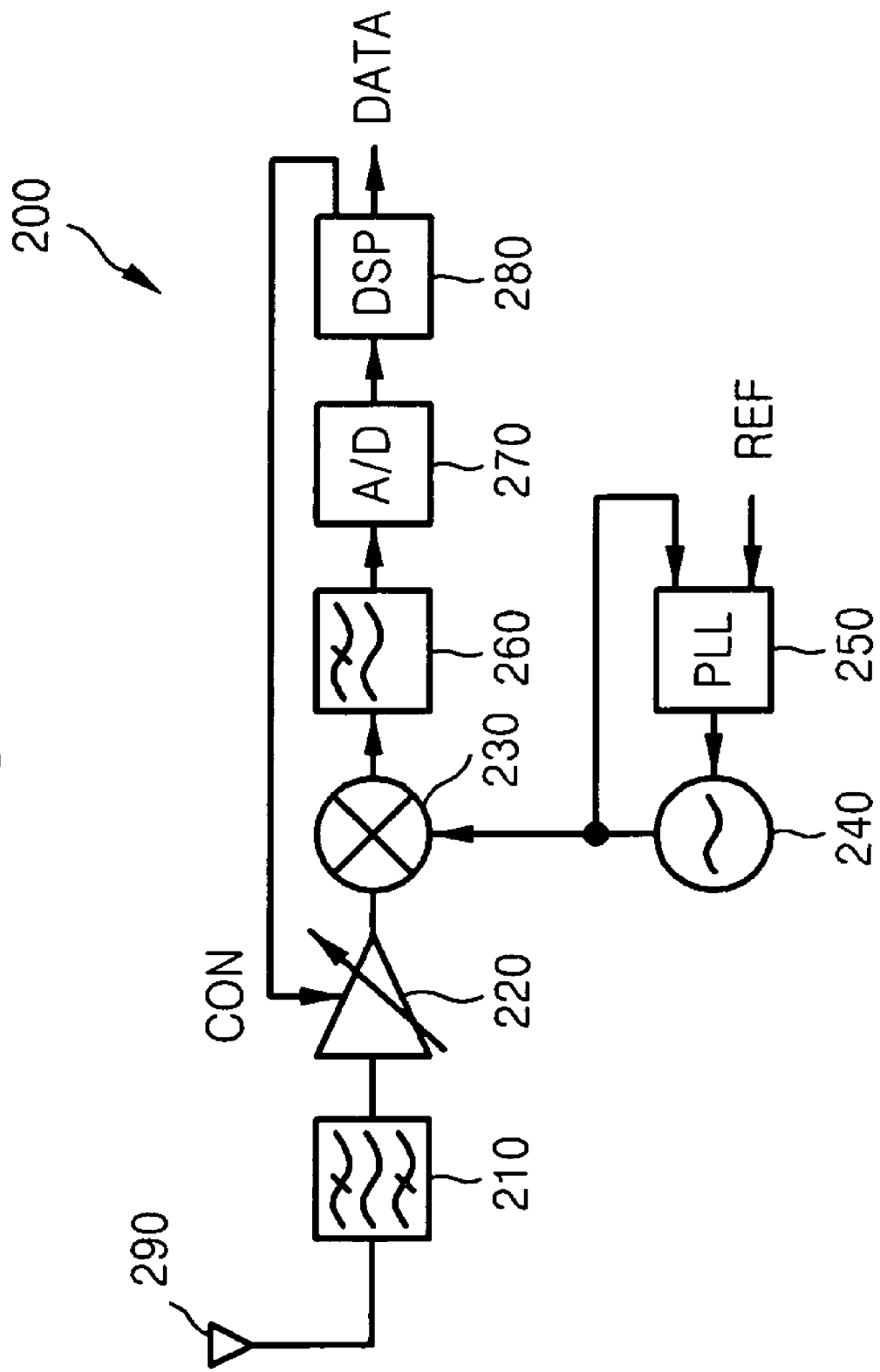
FIG. 2 is a block diagram of a wide-band wireless communication receiver according to an exemplary embodiment of the present invention.

FIG. 2 is a block diagram of a wide-band wireless communication receiver according to an exemplary embodiment of the present invention. Referring to FIG. 2, a wide-band wireless communication receiver 200 includes first and second filters 210 and 260, a low noise amplifier (LNA) 220, a mixer 230, an oscillator 240, a phase locked loop (PLL) 250, an analog-to-digital (A/D) converter 270, a digital signal processing (DSP) circuit 280, and an antenna 290.

An RF signal input through the antenna 290 passes through the first filter 210 and is amplified by the LNA 220. The LNA 220 is a gain controllable wide-band low noise amplification circuit according to an exemplary embodiment of the present invention. The gain of the LNA 220 is controllable in response to a control signal CON. The control signal CON can be output from the DSP circuit 280. Operations and characteristics of the LNA 220 will be described later in this disclosure.

A local oscillator signal of a predetermined frequency is generated by the oscillator 240. The PLL 250, which compares a predetermined reference frequency signal REF with a feedback signal of the local oscillator signal, controls the oscillator 240 such that the phase and frequency of the reference frequency signal REF and the feedback signal are synchronized with each other, thus controlling the frequency of the local oscillator signal. An output signal of the LNA 220 is mixed by the mixer 230 with the local oscillator signal of a predetermined frequency and converted to a base band signal.

An output signal of the mixer 230 passes through the second filter 260 and is converted by the A/D converter 270 to a digital signal. The digital signal is restored to the original data through a digital signal processing step such as demodulation, deinterleaving, and decoding.

Figure 3:
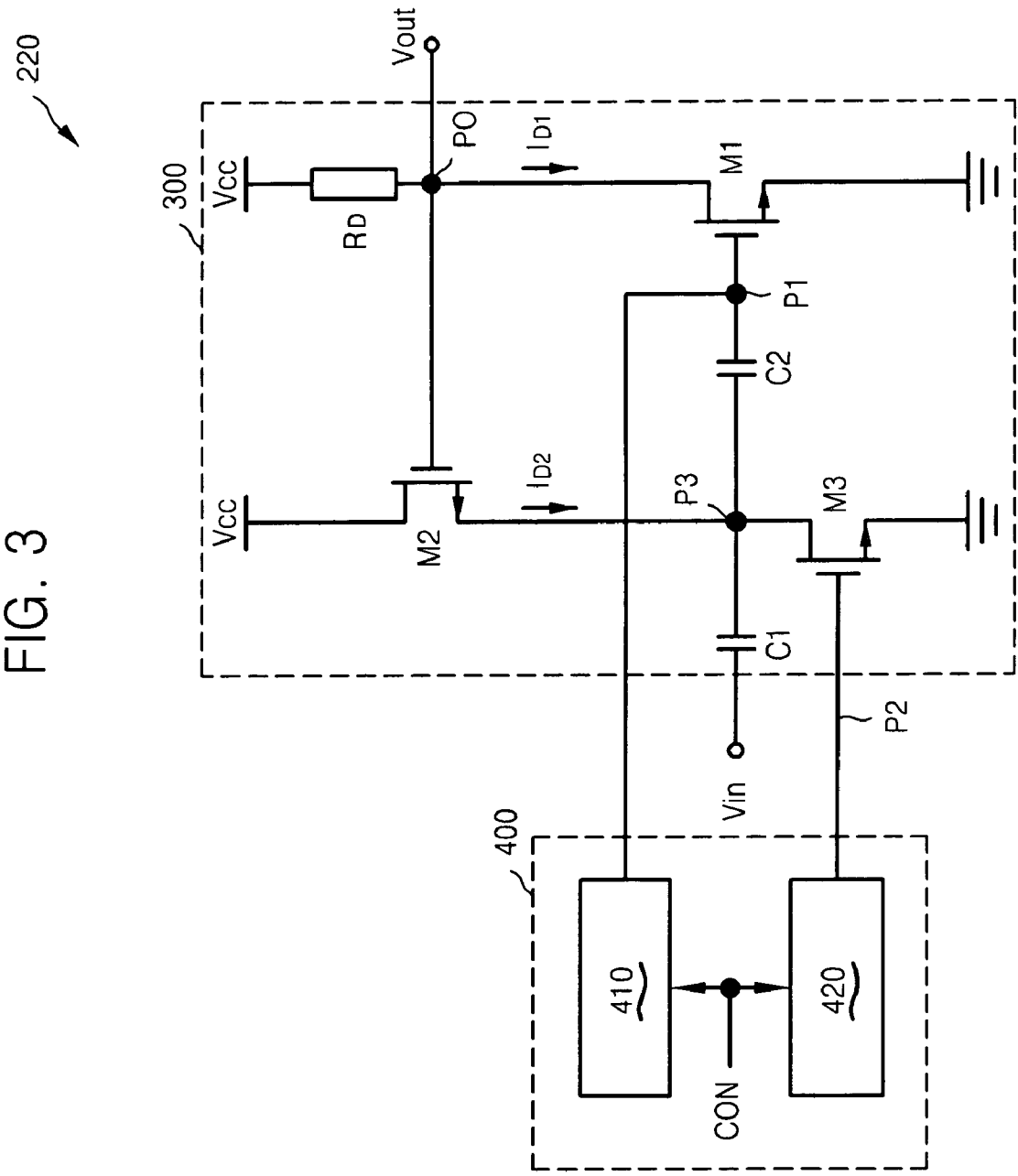
FIG. 3 is a circuit diagram of a gain controllable low noise amplifier according to an exemplary embodiment of the present invention.

FIG. 3 is a circuit diagram of a gain controllable low noise amplifier according to an exemplary embodiment of the present invention. Referring to FIG. 3, the gain controllable LNA 220 includes a main amplification circuit 300 and a control circuit 400. As described above, the LNA 220 can be used as the front end of the wide-band wireless communication receiver 200.

The main amplification circuit 300 generates an output signal Vout in response to an input signal Vin. For example, the main amplification circuit 300 amplifies and outputs the input signal Vin. The main amplification circuit 300 includes first through third transistors M1, M2, and M3 and an output load $R_D$. The first through third transistors M1, M2, and M3 may be embodied by MOSFET devices. It is to be understood that the first through third transistors M1, M2, and M3 can be embodied by other kinds of transistors, for example, bipolar junction transistors. In an exemplary embodiment of the present invention, the first through third transistors M1, M2, and M3 are N type transistors, such as NMOS transistors. The first through third transistors M1, M2, and M3 can be embodied by P type transistors.

The first transistor M1 is an amplifying transistor, which is electrically connected between a first node P1 and an output node P0, receiving and amplifying the input signal Vin. The input signal Vin passes through capacitors C1 and C2 and is input to a gate, that is, the first node P1, of the first transistor M1. The capacitors C1 and C2 that are disposed between an input node and the gate of the first transistor M1 provide DC blocking. The gate of the first transistor M1, that is, the first node P1, is electrically connected to the control circuit 400.

The second transistor M2 is electrically connected between a predetermined node P3 and the output node P0 and feeds back the output signal Vout to the input node. For example, the second transistor M2 is a feedback transistor that feeds back the output signal Vout to the gate of the first transistor M1.

The third transistor M3 is electrically connected to the control circuit 400 via a second node P2, for example, a gate port P2.

The control circuit 400 complementarily controls the magnitude of the currents $I_{D1}$ and $I_{D2}$ respectively flowing through the first and second transistors M1 and M2. The control circuit 400 includes a main control portion 410 controlling the magnitude of the current $I_{D1}$ of the first transistor M1 in response to the control signal CON, and a feedback control portion 420 controlling the magnitude of the current $I_{D2}$ of the second transistor M2 in response to the control signal CON. The control signal CON can be output from the DSP circuit 280 of FIG. 2 as described above. The DSP circuit 280 can change the control signal CON to control the gain of the LNA 220 based on the error rate or S/N ratio of a receiving signal.

The gain Av of an equivalent input impedance Zin of the main amplification circuit 300 according to an exemplary embodiment of the present invention shown in FIG. 3 can be expressed by Equation 3.

$$Zin = \frac{1}{g_{m2}(1 + g_{m1}R_D)} \quad \text{[Equation 3]}$$
$$Av = g_{m1}R_D,$$

where "$g_{m1}$" is a transconductance of the first transistor M1 and "$g_{m2}$" is a transconductance of the second transistor M2.

As can be seen from Equation 3, the gain Av can be changed by controlling the transconductance $g_{m1}$ of the first transistor M1. The transconductance $g_{m1}$ of the first transistor M1 is proportional to the magnitude of the current $I_{D1}$ of the first transistor M1. Thus, the gain Av of the main amplification circuit 300 can be changed by controlling the magnitude of the current $I_{D1}$ of the first transistor M1. In contrast, the input impedance Zin is in inversely proportional to the transconductance $g_{m1}$ of the first transistor M1 and the transconductance $g_{m2}$ of the second transistor M2. When the transconductance $g_{m1}$ of the first transistor M1 is increased, according to an exemplary embodiment of the present invention, the transconductance $g_{m2}$ of the second transistor M2 is complementarily adjusted to decrease the transconductance $g_{m2}$, and the input impedance Zin can be maintained constant. The function of complementarily controlling the transconductance $g_{m1}$ and $g_{m2}$ of the first and second transistors M1 and M2 may be performed by the control circuit 400.

FIG. 4 is a circuit diagram of the control circuit 400 of FIG. 3, according to an exemplary embodiment of the present invention. Referring to FIG. 4, the control circuit 400 is a digital control circuit that controls the transconductance $g_{m1}$ and $g_{m2}$ of the first and second transistors M1 and M2 by controlling the magnitude of the currents $I_{D1}$ and $I_{D2}$ respectively flowing through the first and second transistors M1 and M2, according to digital control signals D0, D1, and D2 that correspond to control signal CON in FIG. 3. The digital control signals D0, D1, and D2 may comprise 3-bit digital signals. However, it is to be understood that the digital control signals can comprise various numbers of bits. Alternatively, the currents $I_{D1}$ and $I_{D2}$ respectively flowing through the first and second transistors M1 and M2 can be complementarily controlled using an analog control circuit.

The control circuit 400 includes the main control portion 410 and the feedback control portion 420. The main control portion 410 includes a current source 415 and a current mirror circuit 413. The current source 415 is a current source supplying a predetermined reference current Iref. The current mirror circuit 413 includes first through seventh PMOS transistors P11-P17 and an NMOS transistor N11. The magnitude of the currents flowing through the second through fourth PMOS transistors P12, P13, and P14 can be controlled by controlling the ratios of the sizes of the PMOS transistors, for example, the ratio of width to length W/L, of the second through fourth PMOS transistors P12, P13, and P14 with respect to that of the first PMOS transistor P11. For example, when the sizes of the second through fourth PMOS transistors P12, P13, and P14 are respectively set to be one, two, and four times greater than the size of the first PMOS transistor P11, the amount of current flowing through the respective second through fourth PMOS transistors P12, P13, and P14 respectively becomes about one, two, and four times greater than the magnitude of the reference current Iref.

The fifth through seventh PMOS transistors P15, P16, and P17 are turned on or off in response to inverse signals D0B, D1B, and D2B of the digital control signals D0, D1, and D2, respectively. When the fifth through seventh PMOS transistors P15, P16, and P17 are turned on, the current flowing through the second through fourth PMOS transistors P12, P13, and P14 is transmitted to the NMOS transistor N11. Thus, the amount of current flowing through the NMOS transistor N11, that is, a first bias current, is controlled according to which one of the fifth through seventh PMOS transistors P15, P16, and P17 is turned on. In an exemplary embodiment of the present invention, the amount of current flowing through the NMOS transistor N11 is controlled by each bit value of the digital control signals D0, D1, and D2.

The NMOS transistor N11 of the main control portion 410 and the first transistor M1 of the main amplification circuit 300 are electrically connected to form a current mirror. The magnitude of the current $I_{D1}$ flowing through the first transistor M1 of the main amplification circuit 300 is proportional to the amount of current for example, the first bias current, flowing through the NMOS transistor N11 of the main control portion 410. The magnitude of the current $I_{D1}$ flowing through the first transistor M1 of the main amplification circuit 300 is controlled by controlling the digital control signals D0, D1, and D2. The transconductance $g_{m1}$ of the first transistor M1 is proportional to the magnitude of the current $I_{D1}$. As can be seen from Equation 3, the gain Av can be changed by controlling the transconductance $g_{m1}$ of the first transistor M1. According to an exemplary embodiment of the present invention, the overall gain Av of the main amplification circuit 300 can be changed by controlling the amount of current $I_{D1}$ flowing through the first transistor M1 using the digital control signals D0, D1, and D2.

The feedback control portion 420 includes a current source 425 and a current mirror circuit 423. The current source 425 is a current source supplying a predetermined reference current Iref. The current mirror circuit 423 includes first through seventh PMOS transistors P21-P27 and an NMOS transistor N21. As in the case of the main control portion 410, as described above, the amount of current flowing through the second through fourth PMOS transistors P22, P23, and P24 can be controlled by controlling the ratios of the sizes of the PMOS transistors, for example, the ratio of width to length W/L, of the second through fourth PMOS transistors P22, P23, and P24 with respect to that of the first PMOS transistor P21.

The gate of fifth PMOS transistor P25 is electrically connected to a predetermined voltage, for example, a ground voltage. In an exemplary embodiment of the present invention, the fifth PMOS transistor P25 is always turned on. The sixth and seventh PMOS transistors P26 and P27 are respectively turned on or off in response to the digital control signals D1 and D2. When the fifth through seventh PMOS transistors P25, P26, and P27 are turned on, the current flowing through the second through fourth PMOS transistors P22, P23, and P24 is transmitted to the NMOS transistor N21.

Thus, the amount of current flowing through the NMOS transistor N21, that is, a second bias current, is controlled by the bit values of the digital control signals D1 and D2. The NMOS transistor N21 of the feedback control portion 420 and the second transistor M2 of the main amplification circuit 300 are electrically connected to form a current mirror. The magnitude of the current $I_{D2}$ flowing through the second transistor M2 of the main amplification circuit 300 is proportional to the amount of current for example, the second bias current, flowing through the NMOS transistor N21 of the feedback control portion 420. The magnitude of the current $I_{D2}$ flowing through the second transistor M2 of the main amplification circuit 300 is controlled by controlling the digital control signals D1 and D2.

In an exemplary embodiment of the present invention, the main control portion 410 controls the magnitude of the current $I_{D1}$ of the first transistor M1 in response to the inverse signals D0B, D1B, and D2B of the digital control signals D0, D1 and D2, while the feedback control portion 420 controls the magnitude of the current $I_{D2}$ of the second transistor M2 in response to the digital control signals D1 and D2, so the magnitudes of the currents $I_{D1}$ and $I_{D2}$ are complementarily controlled. For example, when the current $I_{D1}$ of the first transistor M1 is controlled to increase, the current $I_{D2}$ of the second transistor M2 is controlled to decrease, and vice versa. Thus, the transconductance $g_{m1}$ of the first transistor M1 and the transconductance $g_{m2}$ of the second transistor M2 are inversely proportional to each other. As can be seen from Equation 3, the input impedance Zin can be maintained substantially unchanged. For example, even when the gain Av is changed as the transconductance $g_{m1}$ of the first transistor M1 is controlled, the transconductance $g_{m2}$ of the second transistor M2 is complementarily controlled, and the input impedance Zin does not change substantially.

Figure 5:
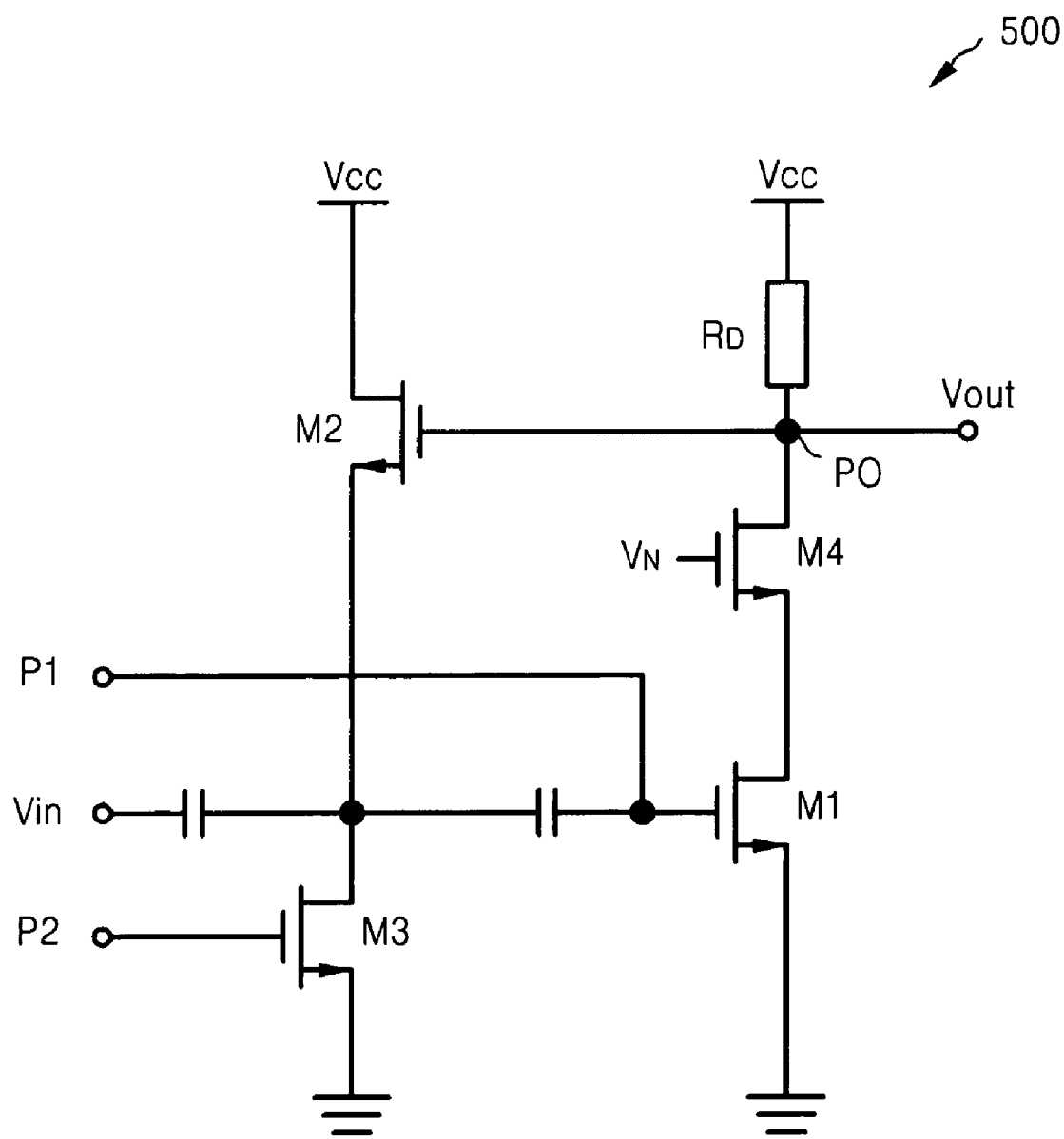
FIG. 5 is a circuit diagram of a main amplification circuit according to an exemplary embodiment of the present invention.

FIG. 5 is a circuit diagram of a main amplification circuit according to an exemplary embodiment of the present invention. Referring to FIGS. 3 and 5, a main amplification circuit 500 shown in FIG. 5 includes a fourth transistor M4, which is not included in the main amplification circuit 300 shown in FIG. 3. The fourth transistor M4 includes three ports, such as a drain, a source, and a gate, which are respectively connected to the output node PO, the first transistor M1, and a predetermined node or voltage $V_N$.

The fourth transistor M4 is electrically connected to the first transistor M1 in a cascade form, for example, to improve the isolation characteristic of each of the input signal Vin and the output signal Vout. The fourth transistor M4 may reduce a degree of the output signal Vout affecting the input signal Vin and stability of the circuit may be improved.

The output load $R_D$ may be implemented by connecting a resistance device and an inductance device in series. The output impedance can be maintained constant even when a frequency changes by the decrease in the output impedance is offset as the frequency increases due to a capacitance component parasitizing on the output node PO.

Figure 6:
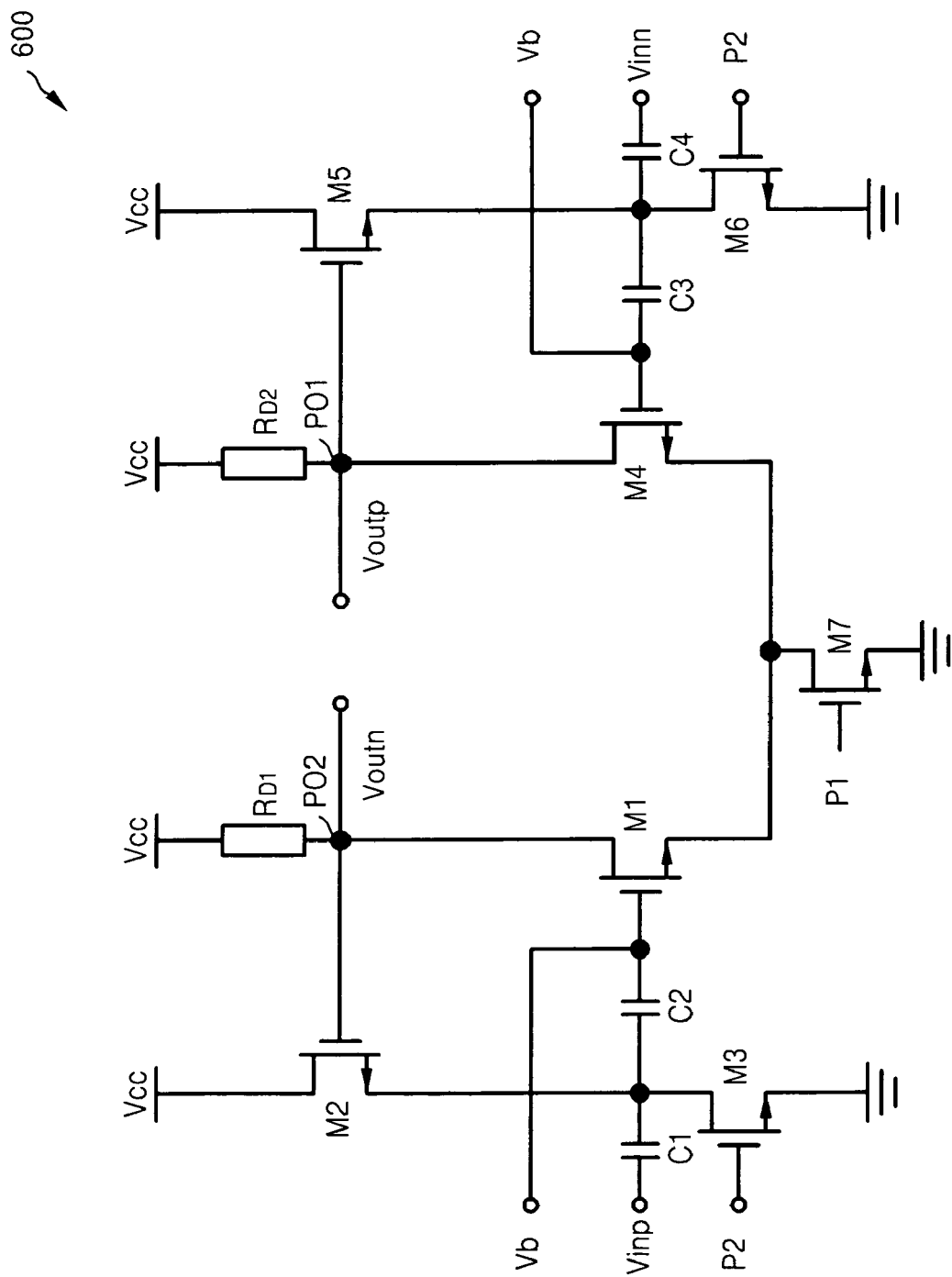
FIG. 6 is a circuit diagram of a main amplification circuit according to an exemplary embodiment of the present invention.

FIG. 6 is a circuit diagram of a main amplification circuit according to an exemplary embodiment of the present invention. A main amplification circuit 600 shown in FIG. 6 is a differential amplifier. Referring to FIG. 6, the main amplification circuit 600 includes a first transistor pair M1 and M4, a second transistor pair M2, and M5, a third transistor pair M3 and M6, and an output load pair $R_{D1}$ and $R_{D2}$. Although the first, second, and third transistor pairs M1 & M4, M2 & M5, and M3 & M6 are embodied as pairs, the roles thereof are respectively the same as those of the first, second, and third transistors M1, M2, and M3.

The first transistor pair M1 and M4 respectively receives and amplifies differential input signals Vinp and Vinn and output differential output signals Voutp and Voutn. The sources of the first transistor pair M1 and M4 are connected in common, and a predetermined voltage Vb is applied to the gates thereof. A bias transistor M7 is provided between the source and the ground of the first transistor pair M1 and M4. The current flowing through the bias transistor M7 is the sum of the currents flowing through the first transistor pair M1 and M4. Thus, the amount of current flowing through the first transistor pair M1 and M4 is controlled by the main control portion 410.

The second transistor pair M2 and M5 respectively feedback differential output signals Voutp and Voutn to input nodes corresponding thereto. The third transistor pair M3 and M6 is electrically connected to the feedback control portion 420 via the second node P2, and the magnitude of the currents flowing through the second transistor pair M2 and M5 is complementarily controlled with respect to the amount of current flowing through the first transistor pair M1 and M4. The main amplification circuit 600 shown in FIG. 6 may further include a fourth transistor pair (not shown), which is electrically connected between the first transistor pair M1 and M4 and differential output nodes PO1 and PO2, comprising a differential amplifier in a cascade form.

Figure 7:
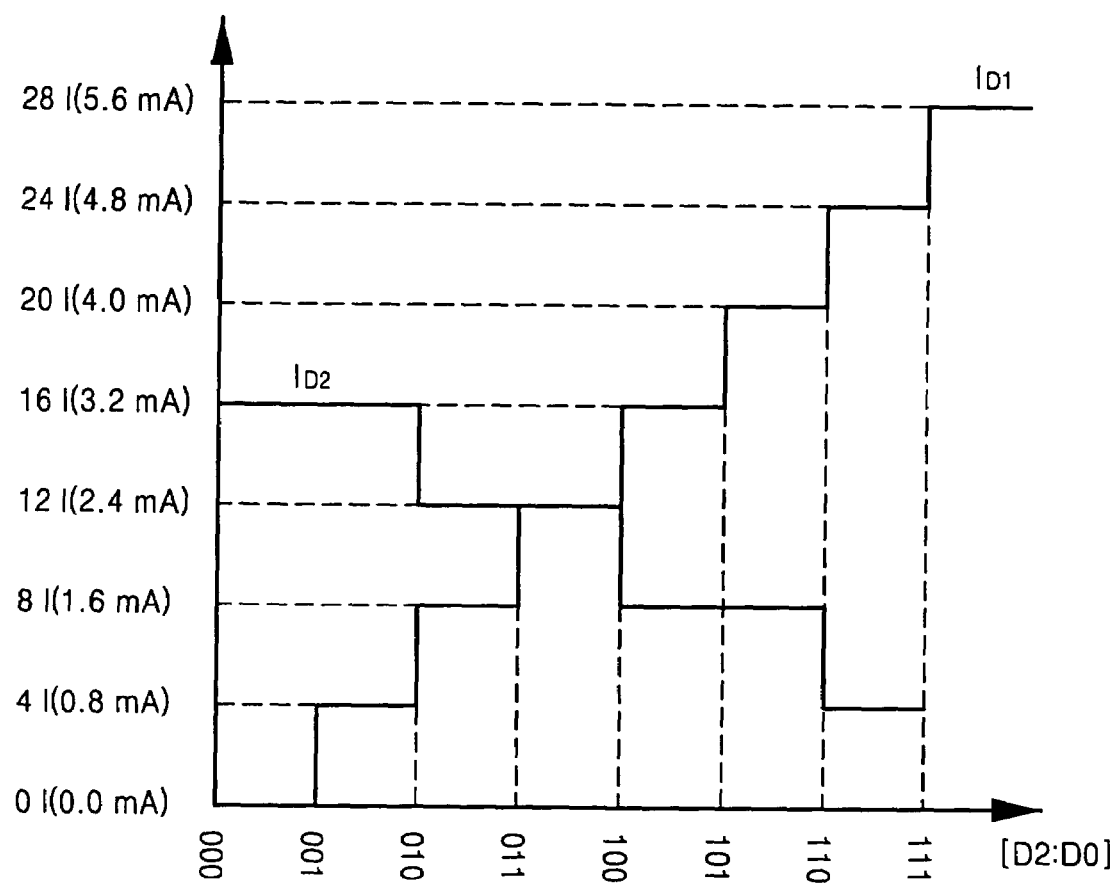
FIG. 7 is a graph showing the change in the magnitude of the transistor current of the first and second transistors according to a digital control signal in the gain controllable low noise amplifier of FIG. 3.

FIG. 7 is a graph showing the change in the magnitude of the transistor currents $I_{D1}$ and $I_{D2}$ of the first and second transistors M1 and M2 according to a digital control signal [D2:D0] in the gain controllable low noise amplifier 220 of FIG. 3. The digital control signal [D2:D0] indicates a code value of the digital control signals D0, D1, and D2 composed of three bits.

Referring to FIG. 7, the amount of current $I_{D1}$ of the first transistor M1 increases as the code value [D2:D0] of the digital control signals D0, D1, and D2 changes from 000 to 111. Since the code value is a digital value, the magnitude of the current $I_{D1}$ of the first transistor M1 increases in a step form. As the code value [D2:D0] of the digital control signals D0, D1, and D2 changes from 000 to 111, the magnitude of the current $I_{D2}$ of the second transistor M2 decreases in the step form. In an exemplary embodiment of the present invention, the ratios of the sizes of the PMOS transistors, for example, the ratio of width to length W/L, of the second through fourth PMOS transistors P12, P13, and P14 with respect to that of the first PMOS transistor P11 of the main control portion 410 of FIG. 4 are four, eight, and sixteen times, respectively. The ratios of the sizes of the PMOS transistors, for example, the ratio of width to length W/L, of the second through fourth PMOS transistors P22, P23, and P24 with respect to that of the first PMOS transistor P21 of the feedback control portion 420 of FIG. 4 are four, four, and sixteen times, respectively. The magnitude of the reference current Iref is 0.2 mA.

Figure 8:
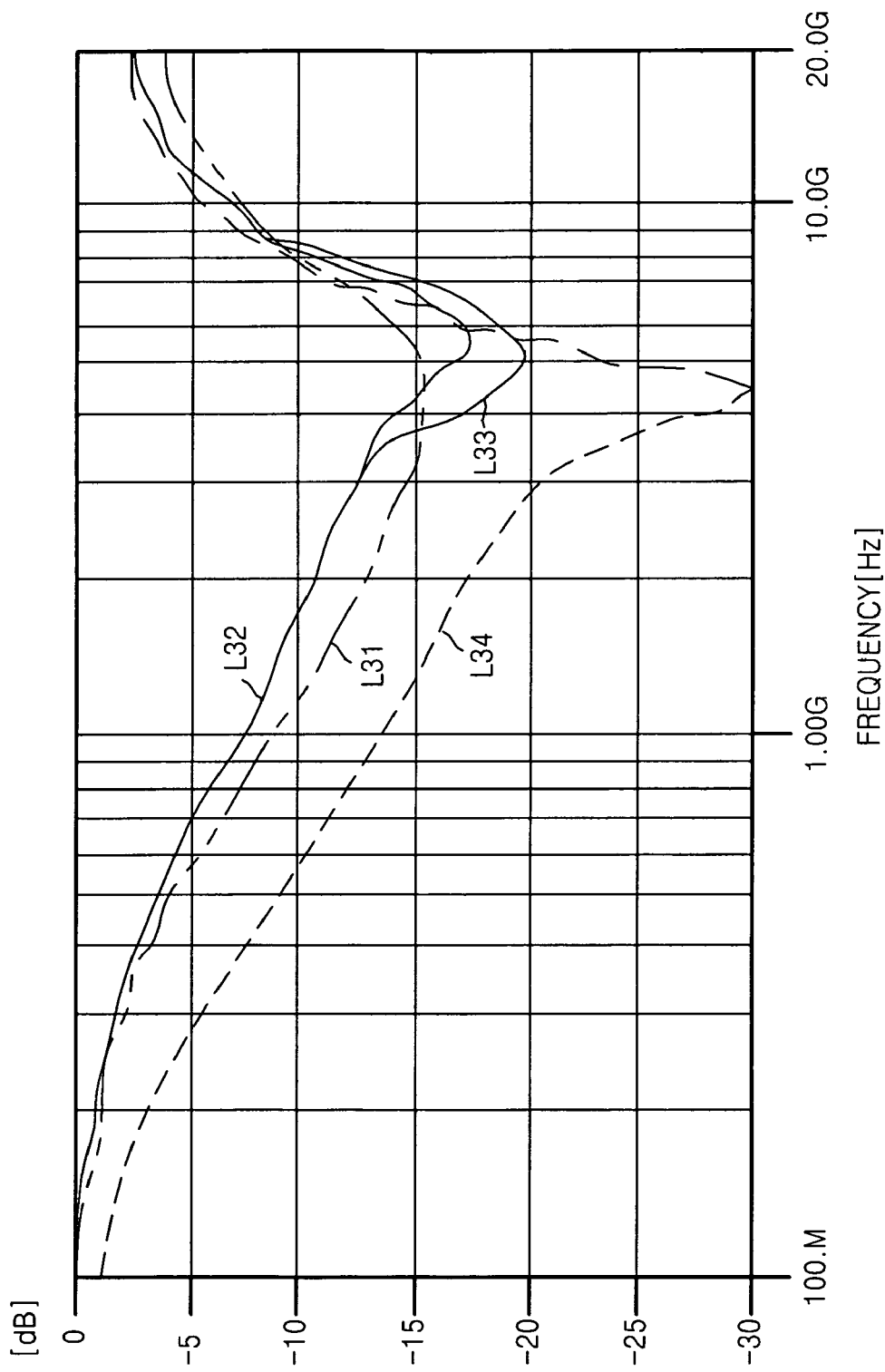
FIG. 8 is a graph showing the relationship between the gain and the noise figure of the gain controllable low noise amplifier of FIG. 3.

FIG. 8 is a graph showing the relationship between the gain Av and the noise figure NF of the gain controllable low noise amplifier of FIG. 3. Referring to FIG. 8, a first group S1 includes graphs L11, L12, L13, and L14 indicating the gains Av according to the frequency when the digital control signals D2, D1, and D0 are <001>, <011>, and <101>, respectively. A second group S2 includes graphs L21, L22, L23, and L24 indicating the noise figure NF according to the frequency when the digital control signals D2, D1, and D0 are <001>, <011>, <101>, and <111>, respectively.

Referring to the first group graphs L11, L12, L13, and L14, it can be seen that the gain Av is variable by controlling the digital control signals D2, D1, and D0. For example, the gain Av increases as the digital control signals D2, D1, and D0 change from <001> to <111>. When the digital control signals D2, D1, and D0 are fixed, the gain Av is substantially constant within a frequency range of 2.0 through 8.0 GHz. The noise figure NF decreases as the digital control signals D2, D1, and D0 change from <001> to <111>. When the digital control signals D2, D1, and D0 are fixed, the noise figure NF is substantially constant within a frequency range of 2.0 through 8.0 GHz.

Figure 9:
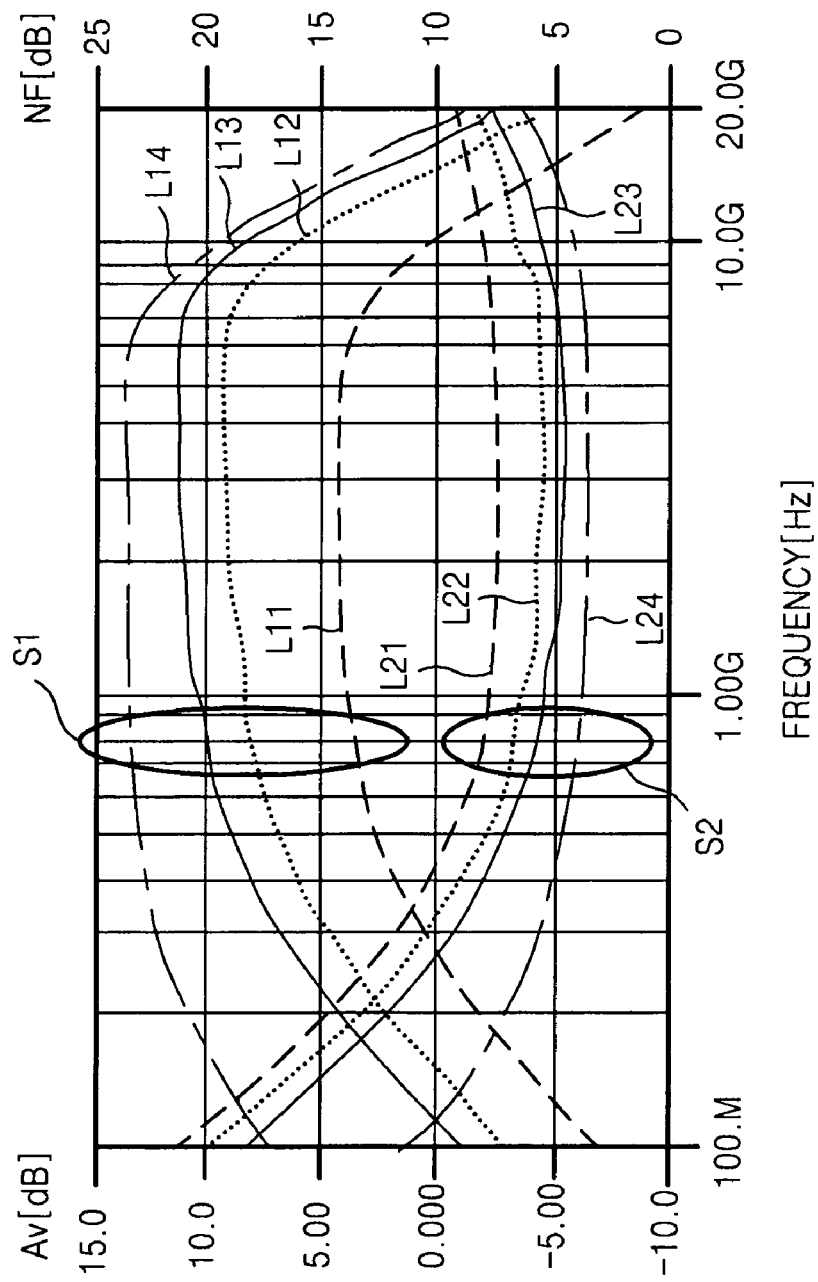
FIG. 9 is a graph showing the input impedance matching of the gain controllable low noise amplifier of FIG. 3.

FIG. 9 is a graph showing the input impedance matching of the gain controllable low noise amplifier of FIG. 3. FIG. 9 shows the input matching characteristics L31, L32, L33, and L34 according to the frequency when the digital control signals D2, D1, and D0 are <001>, <011>, <101>, and <111>, respectively. Referring to FIG. 9, it can be seen that the input matching characteristic has a value of not more than −10 dB within a frequency range of 2.0 through 8.0 GHz. This means that the input impedance matching within the frequency range is excellent.

As described above, in the low noise amplification circuit according to an exemplary embodiment of the present invention, the gain can be changed without breaking the input impedance matching within a wide frequency band range. Also, the noise characteristic may be improved as compared to the conventional low noise amplification circuit. Although exemplary embodiments of the present invention have been described in detail with reference to the accompanying drawings for the purpose of illustration, it is to be understood that the inventive processes and apparatus should not be construed as limited thereby. It will be readily apparent to those of reasonable skill in the art that various modifications to the foregoing exemplary embodiments can be made without departing from the scope of the invention as defined by the appended claims, with equivalents of the claims to be included therein.

What is claimed is:

1. A gain controllable wide-band low noise amplifier comprising:
   a first transistor, coupled to an input node and an output node, amplifying an input signal to generate an output signal;
   a second transistor allowing the output signal to feedback to the input node; and
   a control circuit complementarily controlling transconductance of the first and second transistors,
   wherein the control circuit comprises:
   a main control portion having an output connected to the input node and controlling the amount of current flowing through the first transistor in response to a digital control signal; and
   a feedback control portion complementarily controlling the amount of current flowing through the second transistor with respect to the amount of current flowing through the first transistor in response to an inverse of the digital control signal.

2. The low noise amplifier of claim 1, further comprising a third transistor electrically connected to the second transistor and the feedback control portion.

3. The low noise amplifier of claim 2, wherein tie main control portion comprises:
   a first current source supplying a predetermined magnitude of a first reference current;
   a first current mirror circuit generating a first bias current proportional to the magnitude of the first reference current in response to a complementary signal of the control signal; and
   a second current mirror circuit electrically connected to the first transistor in a current mirror form and allowing the amount of current flowing through the first transistor to be proportional to the magnitude of the first bias current.

4. The low noise amplifier of claim 3, wherein the feedback control portion comprises:
   a second current source supplying a predetermined magnitude of a second reference current;
   a third current mirror circuit generating a second bias current proportional to the amount of the second reference current in response to the control signal; and
   a fourth current mirror circuit electrically connected to the third transistor in the current mirror form and allowing the amount of current flowing through the second transistor to be proportional to the magnitude of the second bias current.

5. The low noise amplifier of claim 2, further comprising a fourth transistor disposed between the first transistor and the output node.

6. The low noise amplifier of claim 1, further comprising an output load provided between the output node and a power voltage node, the output load including a resistance device and an inductance device electrically connected in series.

7. A gain controllable wide-band low noise amplifier comprising:
   an amplification portion including a first transistor connected to first node for amplifying an input signal to generate an output signal at an output node;
   a feedback portion including a second transistor connected between a predetermined node and the output node and allowing the output signal to feedback to an input node;
   a control circuit connected to the first node for complementarily controlling the amount of current flowing through the amplification portion and the amount of current flowing through the feedback portion; and
   a third transistor connected to the control circuit and the predetermined node for controlling a current flowing through the second transistor.

8. The low noise amplifier of claim 7, wherein the first transistor of the amplification portion comprises an amplification transistor coupled to the input node and an output node, wherein the second transistor of the feedback portion comprises a feedback transistor coupled to the output node and the input node, and wherein the control circuit controls the amount of current flowing through the amplification transistor and the amount of current flowing through the feedback transistor to be inversely proportional to each other.

9. The low noise amplifier of claim 7, wherein the first transistor of the amplification portion comprises an amplification transistor pair coupled to the input node and an output node, wherein the second transistor of the feedback portion comprises a feedback transistor pair coupled to the output node and the input node, and wherein the control circuit controls the amount of current flowing through the amplification transistor pair and the amount of current flowing through the feedback transistor pair to be inversely proportional to each other.

10. The low noise amplifier of claim 7, wherein the main control portion comprises:
    a first current source supplying a predetermined magnitude of a first reference current;
    a first current mirror circuit generating a first bias current proportional to the magnitude of the first reference current in response to the control signal; and
    a second current mirror circuit controlling the amount of current flowing through the amplification transistor to be proportional to the magnitude of the first bias current, and
    the feedback control portion comprises:
    a second current source supplying a predetermined magnitude of a second reference current;
    a third current mirror circuit generating a second bias current proportional to the magnitude of the second reference current in response to the control signal; and
    a fourth current mirror circuit controlling the magnitude of current flowing through the feedback transistor to be proportional to the magnitude of the second bias current.

11. The low noise amplifier of claim 9, further comprising a fourth transistor disposed between the amplification transistor and the output node.

12. The low noise amplifier of claim 9, further comprising a fourth transistor pair disposed between the amplification transistor pair and the output node.

13. A wide-band wireless communication receiver comprising:
    a low noise amplifier amplifying an input signal;
    a mixer down-converting a frequency of an output signal of the low noise amplifier;
    an A/D converter converting an output signal of the mixer to a digital signal; and
    a digital signal processor restoring original data from the digital signal,
    wherein the low noise amplifier includes:
    an amplification portion amplifying an input signal to generate an output signal;
    a feedback portion allowing the output signal to feedback to an input node; and
    a control circuit complementarily controlling the magnitude of current flowing through the amplification portion and the magnitude of current flowing through the feedback portion, wherein the control circuit comprises:
a main control portion having an output connected to the input node and controlling the amount of current flowing through a first transistor of the amplification portion in response to a digital control signal; and
a feedback control portion complementarily controlling the amount of current flowing through a second transistor of the feedback portion with respect to the amount of current flowing through the first transistor in response to an inverse of the digital control signal.

14. The wide-band wireless communication receiver of claim 13, wherein the digital control signal is output from the digital signal processor.

* * * * *